(12) United States Patent
Hu et al.

(10) Patent No.: US 10,643,697 B2
(45) Date of Patent: *May 5, 2020

(54) DOUBLE BIAS MEMRISTIVE DOT PRODUCT ENGINE FOR VECTOR PROCESSING

(71) Applicant: Hewlett Packard Enterprise Development LP, Houston, TX (US)

(72) Inventors: Miao Hu, Palo Alto, CA (US); Jianhua Yang, Palo Alto, CA (US); John Paul Strachan, San Carlos, CA (US); Ning Ge, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/148,468

(22) Filed: Oct. 1, 2018

(65) Prior Publication Data

US 2019/0035463 A1 Jan. 31, 2019

Related U.S. Application Data

(63) Continuation of application No. 15/522,364, filed as application No. PCT/US2014/063213 on Oct. 30, 2014, now Pat. No. 10,109,348.

(51) Int. Cl.
*G11C 13/00* (2006.01)
*G06G 7/16* (2006.01)
*G06F 17/16* (2006.01)

(52) U.S. Cl.
CPC .......... *G11C 13/0069* (2013.01); *G06F 17/16* (2013.01); *G06G 7/16* (2013.01);
(Continued)

(58) Field of Classification Search
CPC .................................................. G11C 13/0002
(Continued)

(56) References Cited

U.S. PATENT DOCUMENTS 8,395,929 B2 3/2013 Siau
8,559,209 B2 10/2013 Siau
(Continued)

FOREIGN PATENT DOCUMENTS

| JP | 2005-251381 A | 9/2005 |
|----|---------------|--------|
| JP | 2009-282782 A | 12/2009 |
| WO | WO-2013162553 A1 | 10/2013 |

OTHER PUBLICATIONS

International Search Report and Written Opinion, International Application No. PCT/US2014/063213, dated Jul. 8, 2015, pp. 1-7, KIPO.

(Continued)

*Primary Examiner* — Min Huang

(57) ABSTRACT

A double bias dot-product engine for vector processing is described. The dot product engine includes a crossbar array having N×M memory elements to store information corresponding to values contained in an N×M matrix, each memory element being a memristive storage device. First and second vector input registers including N voltage inputs, each voltage input corresponding to a value contained in a vector having N×1 values. The vector input registers are connected to the crossbar array to supply voltage inputs to each of N row electrodes at two locations along the electrode. A vector output register is also included to receive voltage outputs from each of M column electrodes.

20 Claims, 10 Drawing Sheets

(52) U.S. Cl.
CPC ........ *G11C 13/004* (2013.01); *G11C 13/0026* (2013.01); *G11C 2213/77* (2013.01)

(58) Field of Classification Search
USPC .......................................... 365/148
See application file for complete search history.

(56) References Cited

U.S. PATENT DOCUMENTS

| | | |
|---|---|---|
| 8,611,134 B2 | 12/2013 | Carter |
| 10,109,348 B2 * | 10/2018 | Hu ..................... G11C 13/0026 |
| 2007/0233761 A1 | 10/2007 | Mouttet |
| 2007/0279961 A1 * | 12/2007 | Rinerson ................ G11C 5/147 |
| | | 365/148 |
| 2011/0286259 A1 * | 11/2011 | Perner .................... G11C 5/063 |
| | | 365/148 |
| 2012/0106253 A1 | 5/2012 | Scheuerlein et al. |
| 2013/0173683 A1 * | 7/2013 | Carlough .............. G06F 7/5375 |
| | | 708/650 |
| 2014/0104922 A1 | 4/2014 | Tiburzi et al. |
| 2014/0172937 A1 | 6/2014 | Linderman et al. |
| 2015/0117104 A1 | 4/2015 | Senoo |
| 2015/0347896 A1 * | 12/2015 | Roy ........................ G11C 11/54 |
| | | 365/148 |
| 2018/0068722 A1 * | 3/2018 | Friedman ............. G11C 13/004 |

OTHER PUBLICATIONS

W.S. Zhao et al., "Design and Analysis of Crossbar Architecture Based on Complementary Resistive Switching Non-Volatile Memory Cells," ScienceDirect, Aug. 3, 2013, pp. 1-13, Elsevier Inc.

* cited by examiner

US 10,643,697 B2

DOUBLE BIAS MEMRISTIVE DOT PRODUCT ENGINE FOR VECTOR PROCESSING

CROSS REFERENCE TO RELATED APPLICATION

This application is a continuation of co-pending U.S. patent application Ser. No. 15/522,364, filed Apr. 27, 2017, which claims priority to PCT Application Serial No. PCT/US2014/063213, filed Oct. 30, 2014. The entire contents of both are hereby incorporated by reference as though fully set forth herein.

BACKGROUND

Resistive memory elements referred to as memristors are devices that may be programmed to different resistive states by applying electrical voltage or currents to the memristors. After programming, the state of the memristors may be read. The state of the memristors remains stable over a specified time period long enough to regard the device as non-volatile. A number of memristors may be included within a crossbar array in which a number of column lines intersect with a number of row lines at junctions, and the memristors are coupled to the column lines and row lines at the junctions.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

The need for fast and efficient vector-matrix processing techniques arises in many computing applications. For example, vector-matrix operations are utilized in data-compression, digital data processing, neural networks, encryption and optimization, to name a few. A memristive crossbar array can be used to perform vector-matrix or dot product computations. For example, an input voltage signal from each row of the crossbar is weighted by the conductance of the resistive devices in each column and accumulated as the current output from each column. Ideally, if wire resistances can be ignored, the current vector, I, flowing out of the crossbar array will be approximately $I^T = V^T G$, where V is the input voltage vector and G is the conductance matrix, including contributions from each memristor in the memristive crossbar array.

The use of memristors at each junction or cross-point of the crossbar array enables programming the resistance (or conductance) at each such junction corresponding to the values of G, leading to use of the crossbar array as a dot product engine (DPE). However, real circuits possess resistance in the wires, lines, or electrodes that connect the memristors along each column or row, as well as in the memristors at each junction. The resistance attributable to the wires can result in signal degradation—e.g., decrease in voltage—along each row or column. The disclosure provided herein describes a vector-matrix processing system and method utilizing memristor-based crossbar arrays that reduces signal degradation caused by resistance in the wires, lines, or electrodes connecting the memristors along the rows and columns of the crossbar array.

Various examples of the principles disclosed herein are directed to crossbar-memory systems and their use in performing vector-matrix calculations. Memristor crossbar arrays implement matrices and can lead to substantial increases in performance in vector processing when compared to, e.g., graphics processing units or similar accelerators. The low operating energy of memristors can also lead to substantial reductions in power consumption.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Figure 1:
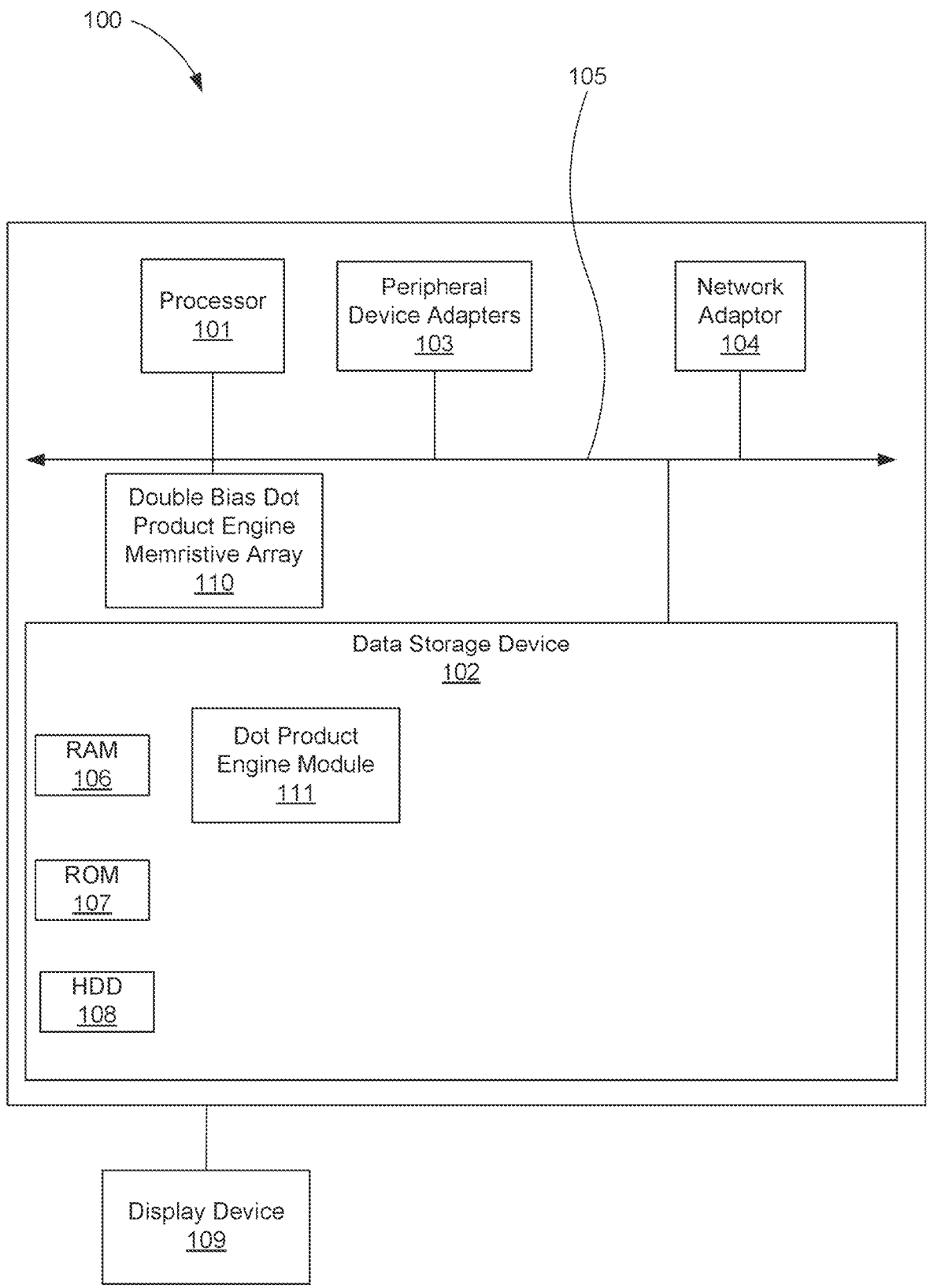
FIG. 1 is a diagram of a computing system for determining a dot product, according to one example of the principles described herein.

Turning now to the figures, FIG. 1 is a diagram of a computing system (100) for determining a dot product, according to one example of the principles described herein. The computing system (100) may be implemented in an electronic device. Examples of electronic devices include servers, desktop computers, laptop computers, personal digital assistants (PDAs), mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. In one example, the methods provided by the computing system (100) are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) includes various hardware components. Among these hardware components may be a number of processors (101), a number of data storage devices (102), a number of peripheral device adapters (103), and a number of network adapters (104). These hardware components may be interconnected through the use of a number of busses and/or network connections. In one example, the processor (101), data storage device (102), peripheral device adapters (103), and a network adapter (104) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of applying a number of first voltages to a corresponding number of row lines within a memristive cross-bar array to change the resistive values of a corresponding number of memristors located at junctions between the row lines and a number of column lines, the first voltages representing a corresponding number of values within a matrix, respectively. The executable code may, when executed by the processor (101), also cause the processor (101) to implement at least the functionality of applying a number of second voltages to a corresponding number of row lines within a memristive cross-bar array, the second voltages representing a corresponding number of vector values. The executable code may, when executed by the processor (101), further cause the processor (101) to implement at least the functionality of collecting the output currents from the column lines, the collected output currents representing the dot product. The functionality of the computing system (100) is in accordance to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage device (102) may include a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing system (100) to interact with and implement the functionality of the computing system (100). The peripheral device adapters (103) may also create an interface between the processor (101) and the display device (109), a printer, or other media output devices. The network adapter (104) may provide an interface to other computing devices within, for example, a network, thereby enabling the transmission of data between the computing system (100) and other devices located within the network.

The computing system (100) may, when executed by the processor (101), display the number of graphical user interfaces (GUIs) on the display device (109) associated with the executable program code representing the number of applications stored on the data storage device (102). The GUIs may display, for example, interactive screenshots that allow a user to interact with the computing system (100) to input matrix and vector values in association with a double bias dot product engine (DPE) memristive array (110) as will be described in more detail below. Additionally, via making a number of interactive gestures on the GUIs of the display device (109), a user may obtain a dot product value based on the input data. Examples of display devices (109) include a computer screen, a laptop screen, a mobile device screen, a personal digital assistant (PDA) screen, and a tablet screen, among other display devices (106).

The computing system (100) may further include a double bias DPE memristive array (110). As will be described in more detail below, the double bias DPE memristive array (110) includes a number of elements including a number of memristors that function together within an array to perform a weighted sum of multiple inputs. The double bias DPE memristive array (110) may be used in a number of applications. For example, the double bias DPE memristive array (110) may be used as a threshold logic gate (TLG) to perform a matrix product to compare the output with a threshold. Thus, the double bias DPE memristive array (110) may be used as an accelerator in which the double bias DPE memristive array (110) performs a number of functions faster than is possible in software running on a more general-purpose processing device. Although the double bias DPE memristive array (110) is depicted as being a device internal to the computing system (100), in another example, the double bias DPE memristive array (110) may be a peripheral device coupled to the computing system (100) or included within a peripheral device coupled to the computing system (100).

The computing system (100) further includes a number of modules used in the implementation of the systems and methods described herein. The various modules within the computing system (100) include executable program code that may be executed separately. In this example, the various modules may be stored as separate computer program products. In another example, the various modules within the computing system (100) may be combined within a number of computer program products; each computer program product including a number of the modules.

The computing system (100) may include a dot product engine module (111) to, when executed by the processor (101), assist in the functionality of the double bias DPE memristive array (110). The dot product engine module (111), for example, receives a number of input values defining a matrix to be processed in a dot product mathematical calculation. The dot product engine module (111) may send the input values to the double bias DPE memristive array (110) as programming signals to a number of memristors within the double bias DPE memristive array (110) to program the memristors. The dot product engine module (111) may also receive a vector input to be processed in connection with the matrix programmed into the memristors. The dot product engine module (111) may further obtain a value representing the dot product, and convey that value as data to the computing system (100) or another computing device for analysis or further processing.

Figure 2A:
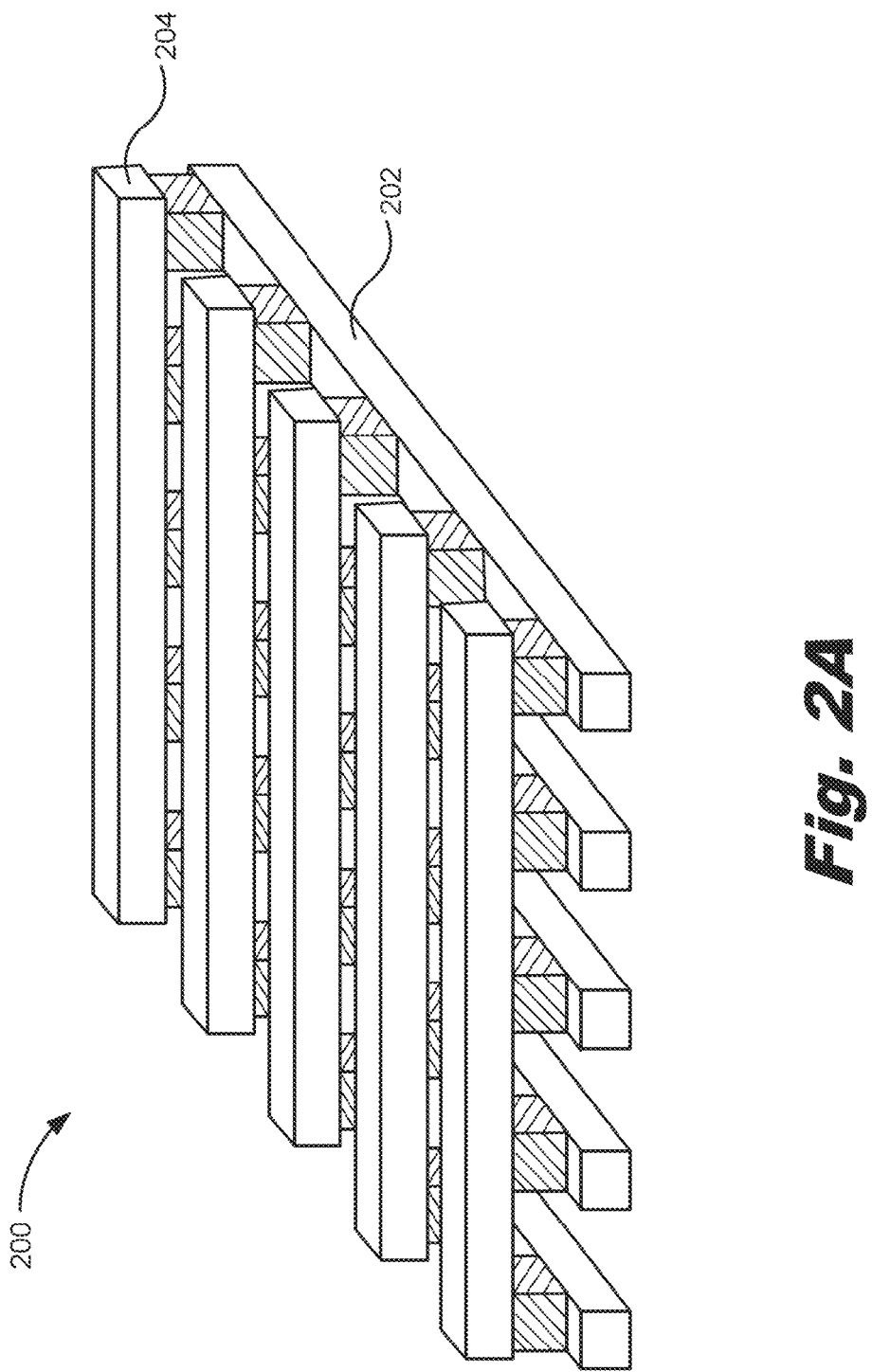
FIGS. 2A, B and C are diagrams of a crossbar array having a memristive device positioned at each crosspoint or junction of the crossbar array according to one example of the principles disclosed herein.

FIGS. 2A, B and C illustrate a crossbar array (200) having a memristive device (206) positioned at each crosspoint or junction of the crossbar array according to one example of the principles disclosed herein. In FIG. 2A, a first layer of approximately parallel electrodes (202) is overlain by a second layer of approximately parallel electrodes (204). For simplicity, one of the first layer of parallel electrodes (202) and one of the second layer of parallel electrodes (204) is indicated with a reference number. The second layer of electrodes (204) is roughly perpendicular, in orientation, to the electrodes (202) of the first layer, although the orientation angle between the layers may vary. The two layers of electrodes form a lattice, or crossbar, each electrode (204) of the second layer overlying the electrodes (202) of the first layer and coming into close contact with each electrode (202) of the first layer at electrode intersections that represent the closest contact between two electrodes (202, 204).

Given the lattice orientation, the first layer of electrodes (202) may be described as columns, while the second layer of electrodes (204) may be described as rows. Although individual electrodes (202, 204) in FIG. 2A are shown with rectangular cross sections, electrodes can also have square, circular, elliptical, or more complex cross sections. The electrodes (202, 204) may also have many different widths or diameters and aspect ratios or eccentricities. The term "crossbar" may refer to crossbars having a layer or layers of sub-microscale wires, microscale wires, or wires with larger dimensions, in addition to electrodes.

Figure 2C:
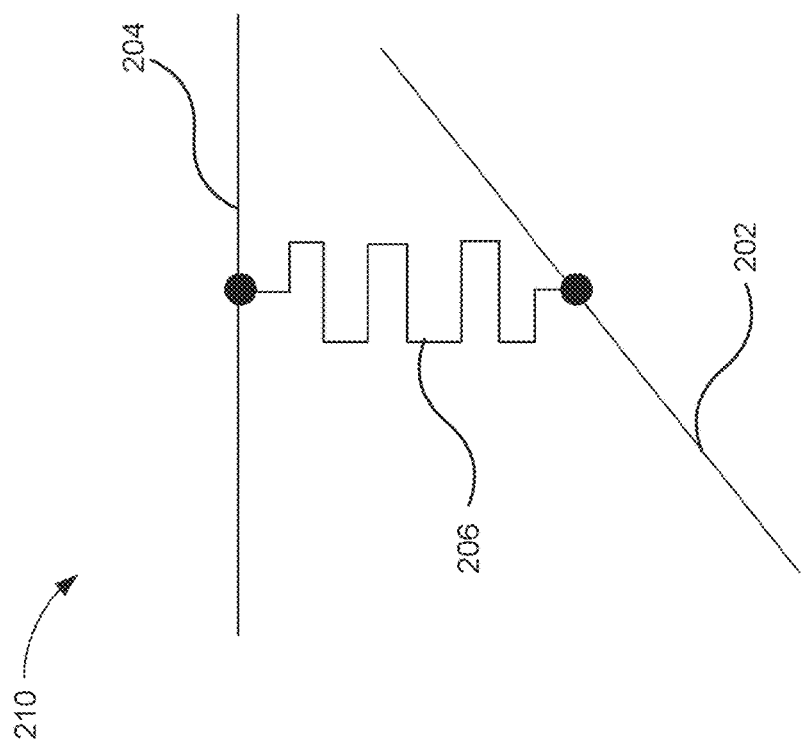
Figure 2B:
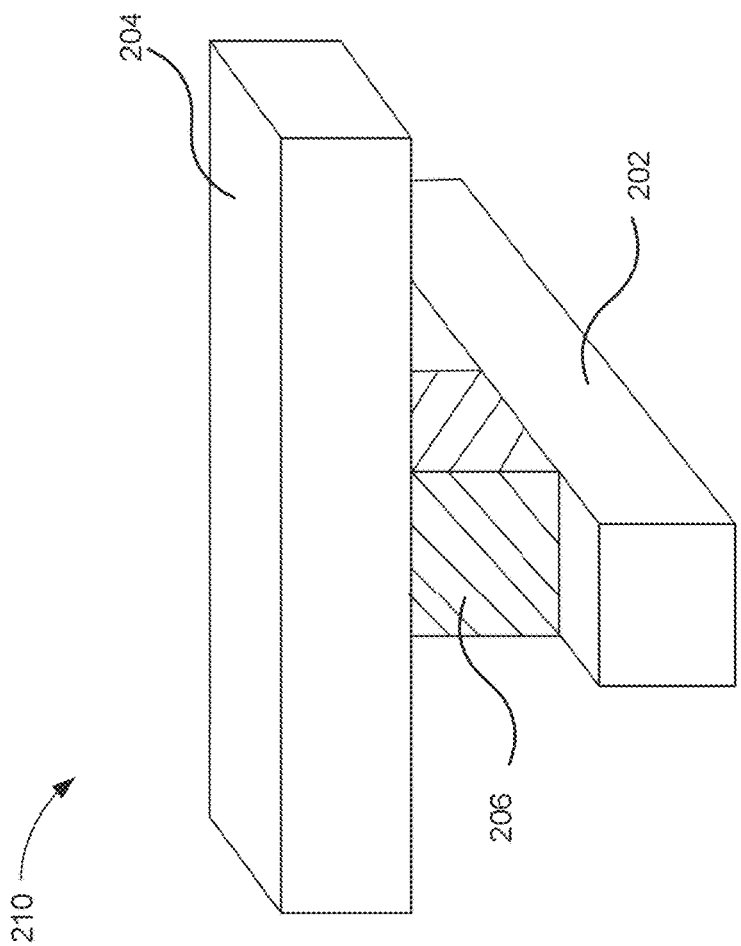

At electrode intersections, electronic components, such as resistors, and other electronic components, can be fabricated to interconnect two overlapping electrodes (202, 204). An electrode intersection connected by electronic components is sometimes called a "crossbar junction." FIGS. 2B and 2C provide two different illustrations of a crossbar junction (210) that interconnects electrode columns (202) and rows (204) of two contiguous layers within a crossbar array. The crossbar junction (210) may or may not involve physical contact between the two electrodes (202, 204). As shown in FIG. 2B, the two electrodes (202, 204) are not in physical contact at their overlap point, but the gap between the electrodes (202, 204) is spanned by a memristive element (206) that lies between the two electrodes (202, 204) at their closest overlap point. FIG. 2C illustrates a schematic representation of the memristive element (206) and overlapping electrodes (202, 204) shown in FIG. 2B. The memristive element (206) is used to represent a memristor and any associated circuitry located at a crossbar junction throughout the remaining figures.

Figure 3:
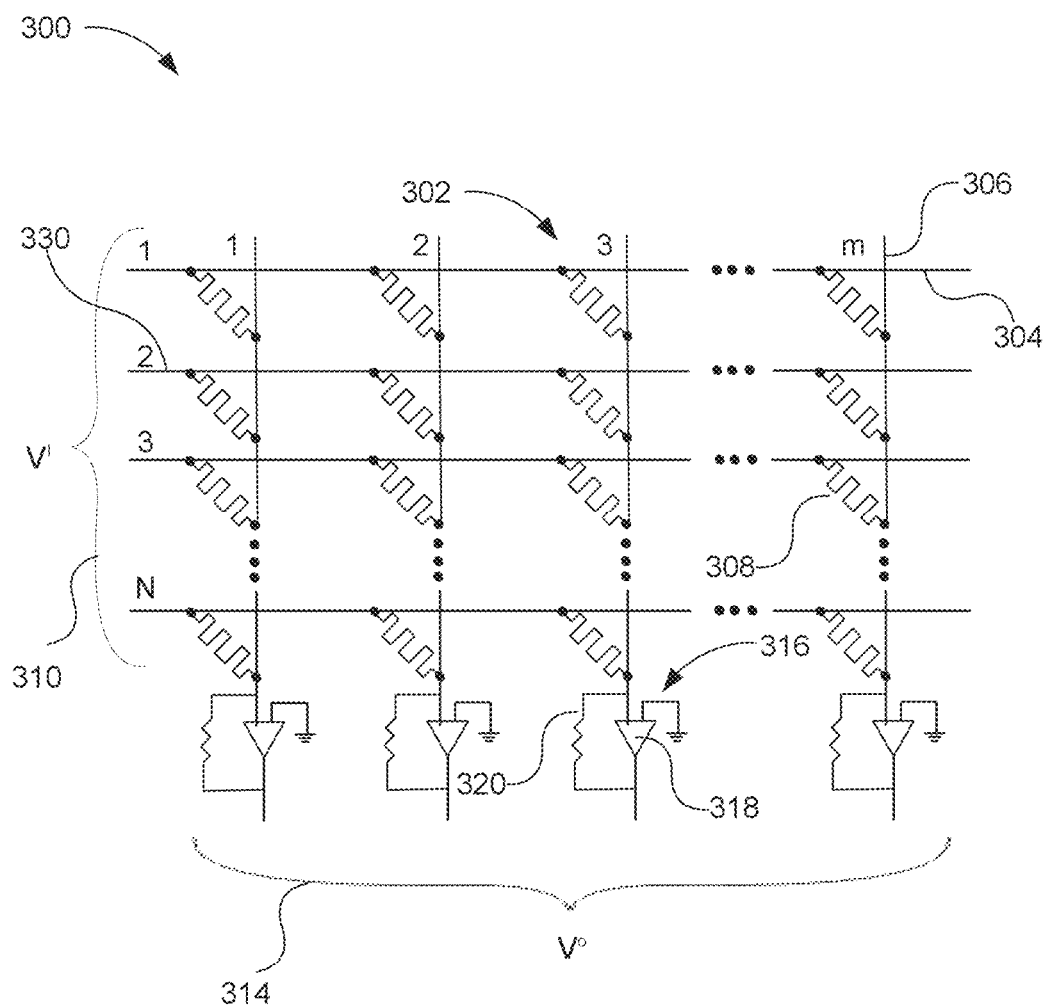
FIG. 3 is a diagram of a memristive dot-product engine according to one example of the principles disclosed herein.

FIG. 3 illustrates a memristive dot-product engine (300) having a single vector of voltage inputs according to one example of the principles disclosed herein. The dot-product engine (300) includes a crossbar array (302) including N row electrodes (304) and M column electrodes (306). The crossbar junctions throughout the crossbar array (302) include a memristive element (308). The dot-product engine (300) includes a vector input register or vector input (310) for applying voltages to the row electrodes (304) and a vector output register or vector output (314) for receiving output voltages resulting from current flows in the column electrodes (306). The dot-product engine (300) also includes sense circuitry (316) for converting an electrical current in a column electrode (306) to a voltage. In an example of the principles described herein, the sense circuitry (316) includes an operational amplifier (318) and a resistor (320), which can be arranged to represent a virtual ground for read operations.

The dot-product engine (300) may also include other peripheral circuitry associated with crossbar arrays (302) used as storage devices. For example, the vector input (310) may include drivers connected to the row electrodes (304). An address decoder can be used to select a row electrode (304) and activate a driver corresponding to the selected row electrode (304). The driver for a selected row electrode (304) can drive a corresponding row electrode (304) with different voltages corresponding to a vector-matrix multiplication or the process of setting resistance values within the memristive elements (308) of the crossbar array (302). Similar driver and decoder circuitry may be included for the column electrodes (306). Control circuitry may also be used to control application of voltages at the inputs and reading of voltages at the outputs of the dot-product engine (300). Digital to analog circuitry and analog to digital circuitry may be used at the vector inputs (310) and at the vector output (314). Input signals to the row electrodes (304) and column electrodes (306) can be either analog or digital. The peripheral circuitry above described can be fabricated using semiconductor processing techniques in the same integrated structure or semiconductor die as the crossbar array (302) in the above example.

In operation, vector and matrix multiplications may be executed through the dot-product engine (300) by applying a set of voltages $V^I$ (310) along the rows (304) of the N×M crossbar array (302) and collecting the currents through the columns (306) and measuring the output voltage $V^O$ (314). On each column, every input voltage (310) is weighted by the corresponding memristance ($1/G_{ij}$) and the weighted summation is reflected at the output voltage (314). Using Ohm's law, the relation between the input voltages (310) and output voltages (314) can be represented by a vector matrix multiplication of the form: $\{V^O\}^T = -\{V^I\}^T[G]R_S$, where $G_{ij}$ is an N×M matrix determined by the conductance (inverse of resistance) of the crossbar array (302), $R_S$ is the resistance value of the sense amplifiers and T denotes the transpose of the M×1 and N×1 vectors, $V^O$ and $V^I$, respectively. The negative sign follows from use of a negative feedback operational amplifier in the sense amplifiers. From the foregoing, it follows that the dot-product engine (300) can be utilized for vector processing and, more specifically, for multiplying a first vector of values $\{b_i\}^T$ by a matrix of values $[a_{ij}]$ to obtain a second vector of values $\{c_j\}^T$, where i=1,N and j=1,M. The vector operation can be set forth in more detail as follows.

$$a_{11}b_1 + a_{21}b_2 + \ldots + a_{N1}b_N = c_1$$

$$\ldots$$

$$a_{1M}b_1 + a_{2M}b_2 + \ldots + a_{NM}b_N = c_M.$$

The vector processing or multiplication using the principles described herein generally starts by mapping a matrix of values $[a_{ij}]$ onto the crossbar array (302) or, stated otherwise, programming—e.g., writing—conductance values $G_{ij}$ into the crossbar junctions of the array (302). With reference still to FIG. 3, in one example, each of the conductance values $G_{ij}$ is set by sequentially imposing a voltage drop over each of the crossbar junctions (FIG. 2, 210). For example, the conductance value $G_{2,3}$ may be set by applying a voltage equal to $V_{Row2}$ at the $2^{nd}$ row of the crossbar array (302) and a voltage equal to $V_{Col3}$ at the $3^{rd}$ column of the array (302). Referring to FIG. 3, in one example, the voltage input, $V_{Row2}$, will be applied to the $2^{nd}$ row at a location (330) occurring at the $2^{nd}$ row electrode adjacent the j=1 column electrode. The voltage input, $V_{Col3}$, will be applied to the $3^{rd}$ column electrode adjacent either the i=1 or i=N location. Note that when applying a voltage at a column electrode (306), the sense circuitry (316) for that electrode may be switched out and a voltage driver switched in. The voltage difference $V_{Row2} - V_{Col3}$ will generally determine the resulting conductance value $G_{2,3}$ based on the characteristics of the memristive element (308) located at the intersection. When following this approach, the unselected columns (306) and rows (304) may be addressed according to one of several schemes, including, for example, floating all unselected columns (306) and rows (304) or grounding all unselected columns (306) and rows (304). Other schemes involve grounding columns (306) or grounding partial columns (306). Grounding all unselected columns (306) and rows (304) is beneficial in that the scheme helps to isolate the unselected columns (306) and rows (304) to minimize the sneak path currents to the selected output column. Following programming, operation of the dot-product engine (300) proceeds by applying the vector of input voltages (310) and reading the vector of output voltages (314).

In accordance with one example of the principles disclosed herein, the memristors used for the dot product engines (300) have a linear current-voltage relation. Linear current-voltage relations permit higher accuracy in the vector multiplication process. However, crossbar arrays (302) having linear memristors are prone to having large sneak path currents during programming of the array (302), particularly when the size of the crossbar array (302) is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths. To alleviate the sneak path currents in such instances, and especially when larger arrays are desired, an access device, such as a non-linear selector or transistor (e.g., a normally ON depletion mode transistor) may be incorporated within or utilized together with the memristive element (308) to minimize the sneak path currents in the array. More specifically, the memristive element (308) should be broadly interpreted to include memristive devices including, for example, a memristor, a memristor and selector, or a memristor and transistor.

Figure 4A:
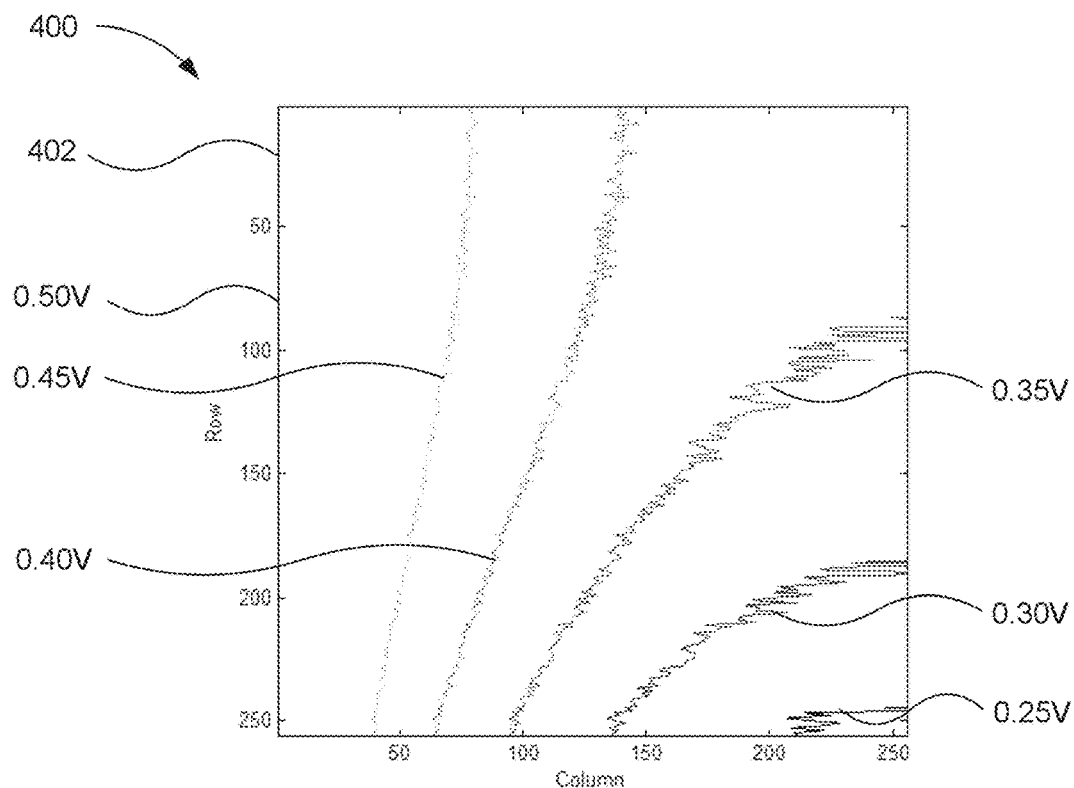
FIGS. 4A and B are graphs of the voltage values measured at the upper and lower surfaces of the crossbar array illustrated in FIG. 3 according to one example of the principles disclosed herein.
Figure 4B:
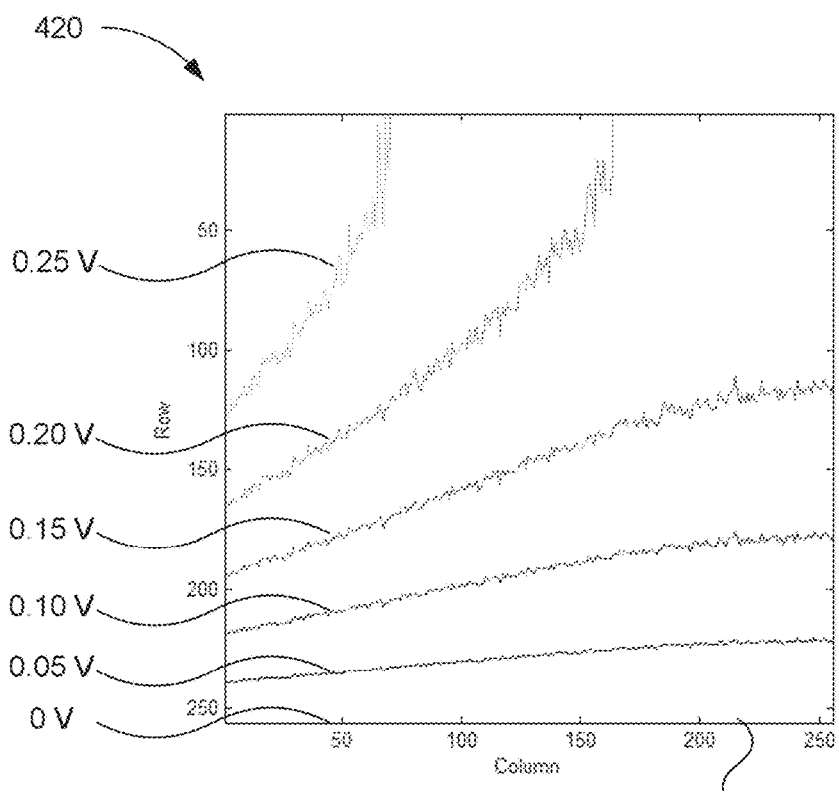

FIGS. 4A and B illustrate upper (400) and lower (420) voltage distributions on the upper and lower layers of electrodes (FIG. 3, 304, 306), respectively, of a crossbar array (FIG. 3, 302) according to one example of the principles described herein. Specifically, a 256×256 row and column crossbar array (FIG. 3, 302), similar to the one illustrated in FIG. 3, is used to illustrate voltage distributions on the upper layer of row electrodes (FIG. 3, 304) and the lower layer of column electrodes (FIG. 3, 306) during a programming operation. In FIGS. 4A and 4B, the input conditions are 0.5 volts applied to each row electrode (FIG. 3, 304) at the input vector (FIG. 3, 310) and ground at the output vector (FIG. 3, 314) with the sense circuitry (FIG. 3, 316) switched out. As illustrated in FIGS. 4A and 4B, a voltage distribution results on the upper and lower surface, leading to signal degradation. For example, the voltage distribution on the upper layer of row electrodes (FIG. 3, 304) starts at 0.50 volts (402) at the voltage input vector (FIG. 3, 310) locations and degrades to approximately 0.25 volts in the vicinity of the i=256, j=256 location. The degradation occurs gradually over the upper surface as evidenced by the contours representing 0.50 volts, 0.45 volts, 0.40 volts, 0.35 volts and 0.30 volts. Similarly, for the bottom layer of column electrodes (FIG. 3, 306), the signal degrades gradually over the surface of column electrodes (FIG. 3, 306) as evidenced by contours representing the applied ground or 0.00 volts (422) adjacent the Nth row, 0.05 volts, 0.10 volts, 0.15 volts, 0.20 volts and 0.25 volts. As is apparent from the distributions, large regions of the crossbar array (FIG. 3, 302) do not experience the full 0.50 volt bias at the upper and lower surfaces of the array (FIG. 3, 302), meaning the memristive elements (FIG. 3, 308) at the crossbar junctions (FIG. 2, 210) may not experience the intended voltage drop across the element. The following examples address the signal degradation discussed above.

Figure 5:
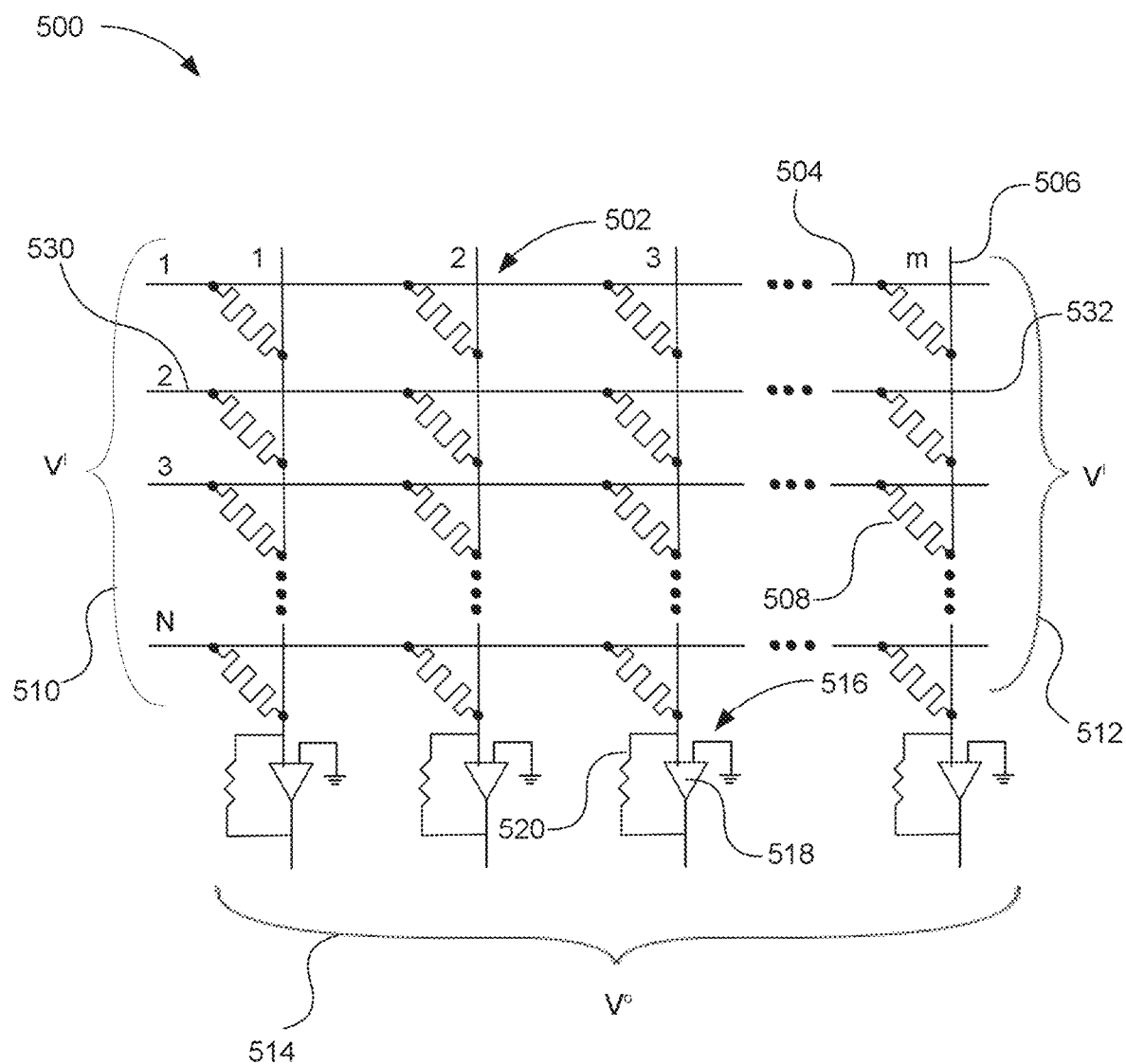
FIG. 5 is a diagram of a double bias memristive dot-product engine according to another example of the principles disclosed herein.

FIG. 5 illustrates a double bias memristive dot-product engine (500) having a double vector of voltage inputs according to one example of the principles disclosed herein. The dot-product engine (500) includes a crossbar array (502) including N row electrodes (504) and M column electrodes (506). The crossbar junctions (FIG. 2, 210) throughout the crossbar array (502) include a memristive element (508). The dot-product engine (500) includes a first vector input register or first vector input (510) for applying voltages to the row electrodes (504). A second vector input register or second vector input (512) for applying voltages to the row electrodes (504) is also incorporated into the dot product engine (500). The dot product engine (500) further includes a vector output register or vector output (514) for receiving output voltages resulting from current flows in the column electrodes (506). The dot-product engine (500) also includes sense circuitry (516) for converting an electrical current in a column electrode (506) to a voltage. In an example of the principles described herein, the sense circuitry (516) includes an operational amplifier (518) and a resistor (520), which can be arranged to represent a virtual ground for read operations. Similar to the example described above, the dot-product engine (500) may also include the peripheral circuitry associated with crossbar arrays (502) used as storage devices, including, for example, driver, decoder, DAC, ADC and control circuitry, all of which can be fabricated using semiconductor processing techniques in the same integrated structure or semiconductor die as the crossbar array (FIG. 3, 302) in the above example.

In one example according to the principles described herein, the first input vector (510) of voltage inputs is applied or connected to the row electrodes (504) adjacent the j=1 column electrode while the second input vector (512) of voltage inputs is applied or connected to the row electrodes (504) adjacent the j=M column electrode. Additional examples position the first and second input vectors (510, 512) of voltage inputs at different locations on the crossbar array (502), such as, for example, the j=¼M and j=¾M columns. In other examples, three or more input vectors (510, 512) of voltage inputs may be utilized. Generally, the voltage inputs will be different for each row. In FIG. 5, however, the same voltages for each row (504) are used to more clearly show the advantage of a double-biasing scheme as compared to a single-biasing scheme. In addition, where the first input vector (510) contains voltage inputs $\{V_i^I\}$ (i=1,N), then, typically, the second input vector (512) will contain the same voltage inputs. The same methodology will generally be applied regardless of which column electrodes (506) are adjacent the inputs (e.g., the j=1 and j=M column electrodes as indicated in FIG. 5) and, also, for examples having three or more input vectors.

In operation, similar to that described above, a matrix of values $[a_{ij}]$ is mapped onto the crossbar array (502), which proceeds by programming—e.g., writing—conductance values $G_{ij}$ into the crossbar junctions of the array (502). In one example, each of the conductance values $G_{ij}$ is set by sequentially imposing a voltage drop over each of the crossbar junctions (FIG. 2, 210). For example, the conductance value $G_{2,3}$ may be set by applying a voltage equal to $V_{Row2}$ at the $2^{nd}$ row of the crossbar array (502) and a voltage equal to $V_{Col3}$ at the $3^{rd}$ column of the array (502). Referring to FIG. 5, in one example, the voltage input, $V_{Row2}$, will be applied to the $2^{nd}$ row in two locations, a first location (530) occurring at the $2^{nd}$ row electrode adjacent the j=1 column electrode and a second location (532) at the $2^{nd}$ row electrode adjacent the j=M column electrode. The voltage input, $V_{Col3}$, will be applied to the $3^{rd}$ column electrode adjacent either the i=1 or i=N location. Note that when applying a voltage at a column electrode (506), the sense circuitry (516) for that electrode may be switched out and a voltage driver switched in. The voltage difference $V_{Row2}-V_{Col3}$ will generally determine the resulting conductance value $G_{2,3}$ based on the characteristics of the memristive element (508) located at the intersection. When following this approach, the unselected columns (506) and rows (504) may be addressed according to one of several schemes, including, for example, floating all unselected columns (506) and rows (504) or grounding all unselected columns (506) and rows (504). Other schemes involve grounding columns (506) or grounding partial columns (506). Grounding all unselected columns (506) and rows (504) is beneficial in that the scheme helps to isolate the unselected columns (506) and rows (504) to minimize the sneak path currents to the selected output column (506). Following programming, operation of the dot-product engine (500) proceeds by applying the first vector of input voltages (510) at the corresponding row electrodes (504) adjacent the j=1 column electrode of the array (502) and the second vector of input voltages (512) at the corresponding row electrodes (504) adjacent the j=M column electrode (506) of the array (502) and reading the vector of output voltages (514).

Figure 6A:
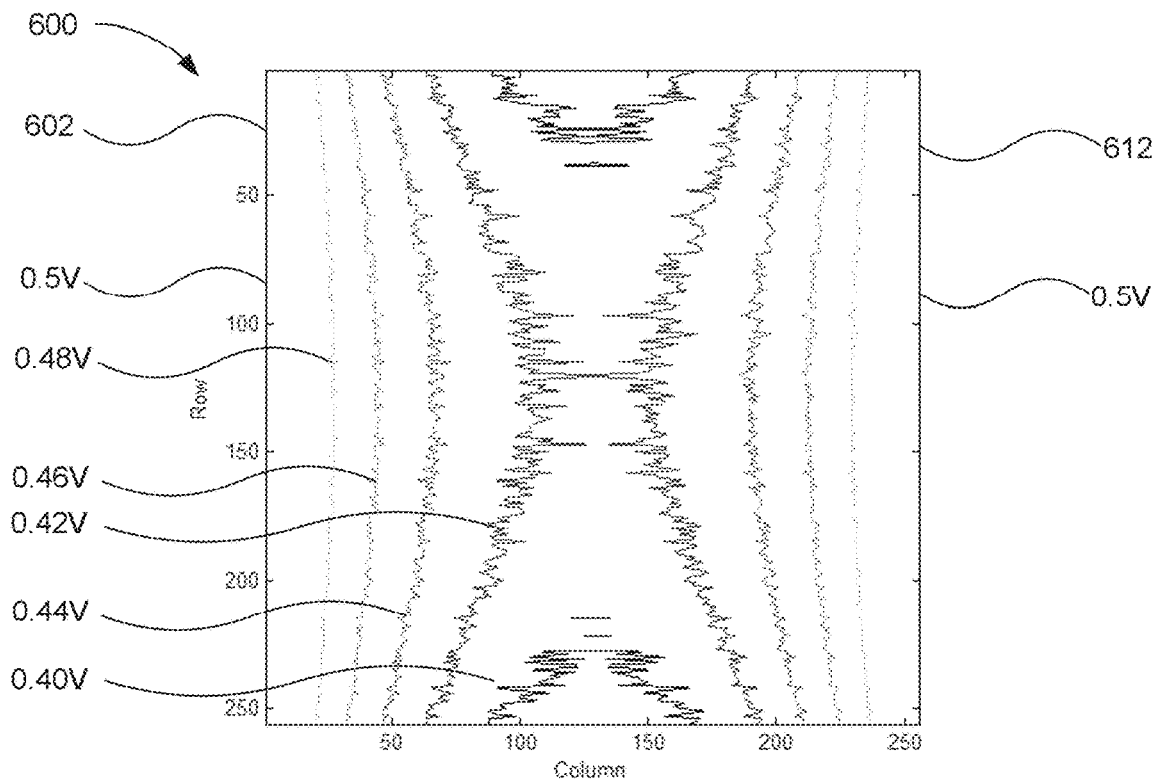
FIGS. 6A and B illustrate the voltage values measured at the upper and lower surfaces of the crossbar array illustrated in FIG. 5 according to one example of the principles disclosed herein.
Figure 6B:
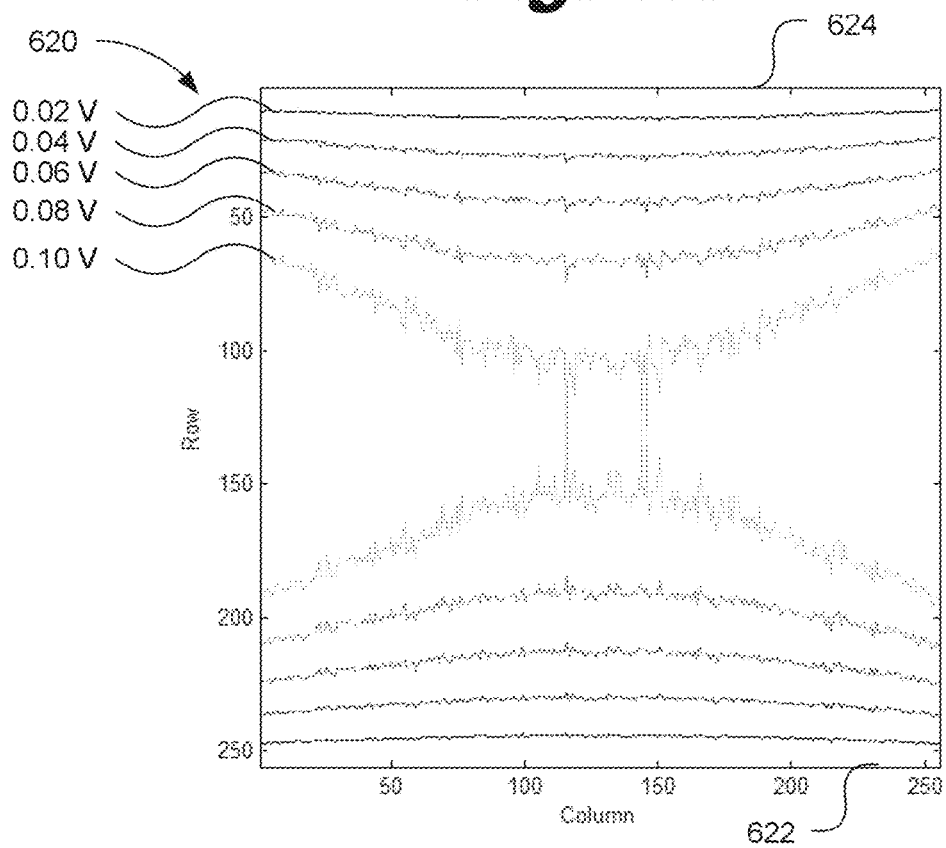

FIGS. 6A and B illustrate upper (600) and lower (620) voltage distributions on the upper and lower layers of electrodes (FIG. 5, 504, 506), respectively, of a crossbar array (FIG. 5, 502) according to one example of the principles described herein. Specifically, a 256×256 row and column crossbar array (FIG. 5, 502), similar to the one illustrated in FIG. 5 (and FIG. 7, described below), is used to illustrate voltage distributions on the upper layer of row electrodes (FIG. 5, 504) and the lower layer of column electrodes (FIG. 5, 506) during a programming operation. The input conditions are 0.5 volts applied to each row at the input vectors (FIG. 5, 510, 512) and ground at the output vector (FIG. 5, 514) with the sense circuitry (FIG. 5, 516) switched out. The column electrodes (FIG. 5, 506) adjacent the upper most or 1st row electrode (FIG. 5, 504) are also biased to ground. As illustrated in FIGS. 6A and 6B, a voltage distribution results on the upper and lower surface, leading to signal degradation. For example, the voltage distribution on the upper layer of row electrodes (FIG. 5, 504) starts at 0.50 volts (602, 612) at the voltage input vector (FIG. 5, 510, 512) locations and degrades to approximately 0.40 volts in the vicinity of the i=1, j=128 and i=256, j=128 row and column electrode (FIG. 5, 504, 506) locations. The degradation occurs gradually over the upper surface as evidenced by the contours representing 0.50 volts, 0.48 volts, 0.46 volts, 0.44 volts, 0.42 volts and 0.40 volts. Similarly, for the bottom layer of column electrodes (FIG. 5, 506), the signal degrades gradually over the surface of column electrodes (FIG. 5, 506) as evidenced by contours representing the applied ground or 0.00 volts (622, 624) adjacent the 1st and Nth rows, 0.02 volts, 0.04 volts, 0.06 volts, 0.08 volts and 0.10 volts.

As is apparent from the distributions, the double-bias voltage input scheme provides increased accuracy over the single-bias input scheme discussed above in at least two regards. First, the signal degradation is generally symmetric, with the largest degradation occurring near the middle of the array (FIG. 5, 502) on both the upper and lower surfaces, rather than near the corner regions for the single-bias scheme. Second, the double-bias scheme results in lower maximum signal degradations on the upper and lower surfaces. For example, the double-bias scheme exhibits a maximum signal degradation of approximately 0.1 volt on each of the upper and lower surfaces, while the single-bias scheme exhibits a maximum signal degradation of approximately 0.25 volts.

Figure 7A:
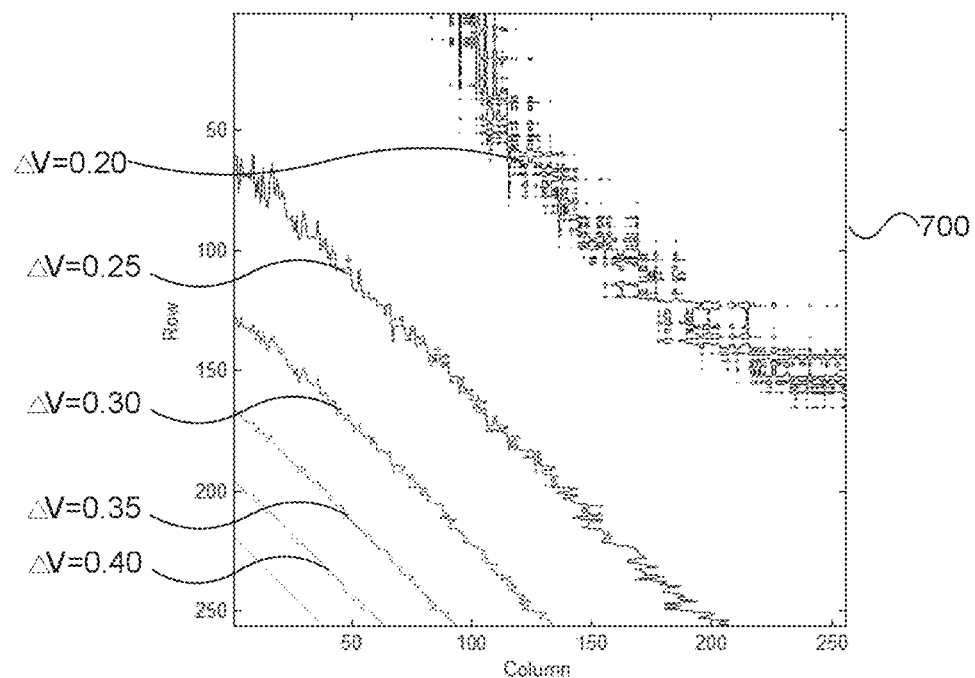
FIGS. 7A and B are graphs of the difference in voltage values measured at the upper and lower surfaces of the crossbar arrays illustrated in FIGS. 3 and 5 according to examples of the principles disclosed herein.
Figure 7B:
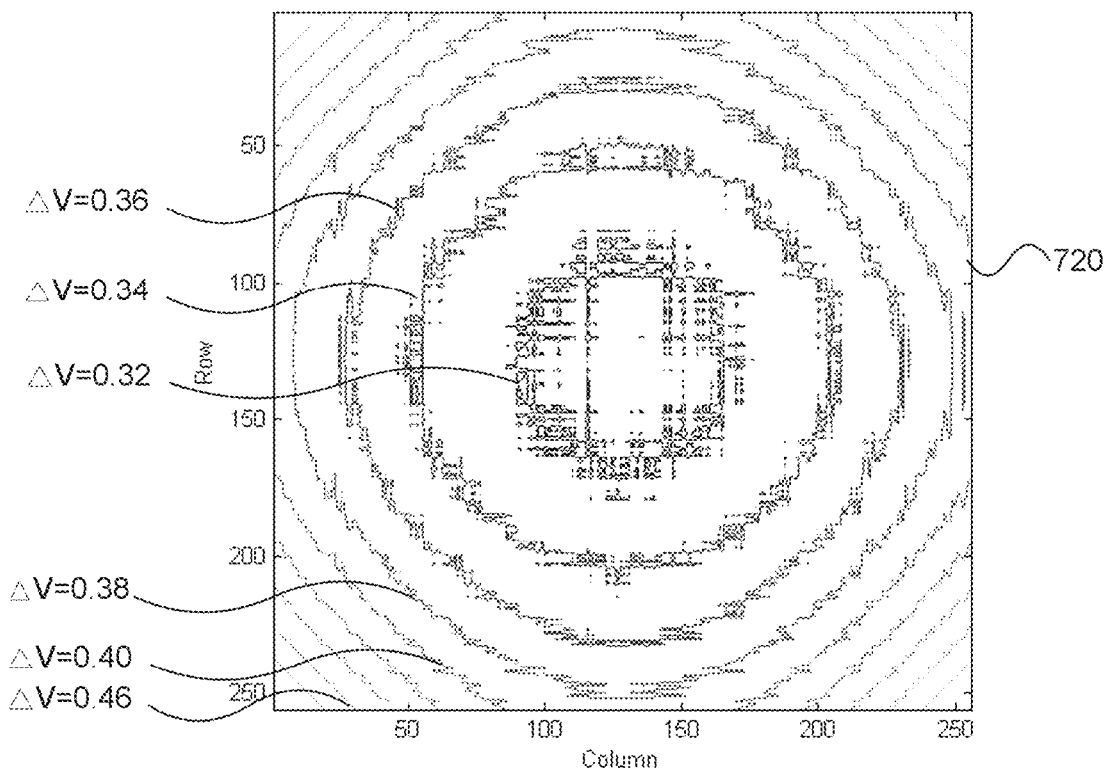

FIGS. 7A and 7B illustrate the voltage difference across the crossbar arrays in the two examples described above.

Specifically, FIG. 7A provides contours of the voltage difference (700) between the upper (FIG. 4, 400) and lower (FIG. 4, 420) voltage distributions illustrated in FIGS. 4A and 4B, respectively, while FIG. 7B provides contours of the voltage difference (720) between the upper (FIG. 6, 600) and lower (FIG. 6, 620) voltage distributions illustrated in FIGS. 6A and 6B, respectively. As seen in the distributions of degradation in the voltage differences (which can represent the voltage across the memristive elements during programming), the double-biasing scheme results in a maximum degradation between the upper and lower surfaces of approximately 0.20 volts (0.5 volts-0.3 volts), while the single-biasing scheme results in a maximum degradation of approximately 0.3 volts (0.5 volts-0.2 volts). Further, the maximum degradation for the double-biasing scheme occurs in the middle of the crossbar array (FIG. 5, 502), while the maximum degradation for the single biasing scheme occurs over a relatively large portion of the crossbar (most of the upper diagonal of the array) when compared to the double-biasing scheme. Accordingly, the double-biasing scheme improves the average error, leading to increased ability to operate denser crossbar arrays accurately during storage of data or while performing dot-product calculations. In addition, because the error is spatially symmetric over the array surfaces, the error may be modelled and compensated for at the output of the DPE (FIG. 5, 500).

Figure 8:
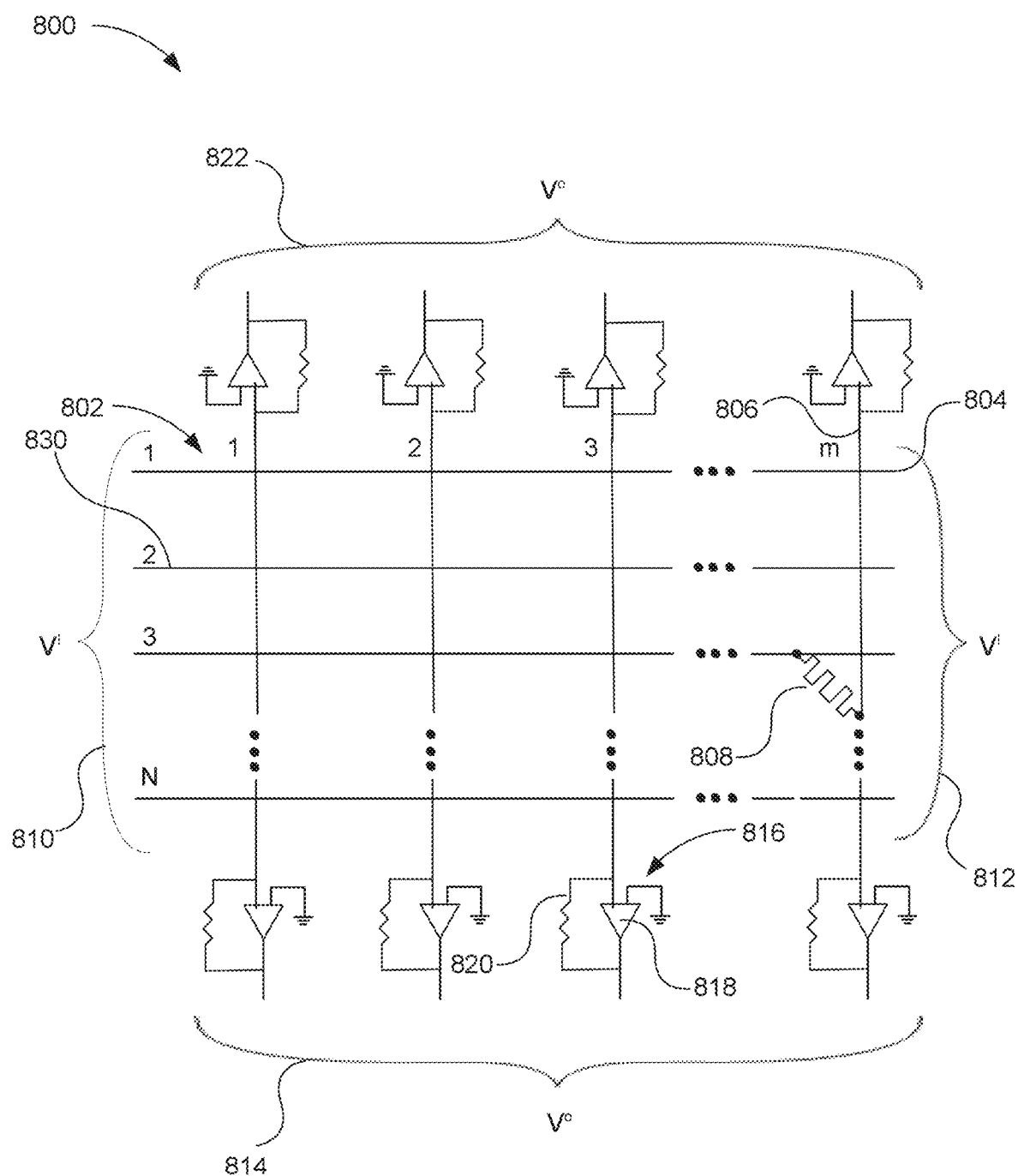
FIG. 8 is a diagram of a double bias memristive dot-product engine according to another example of the principles disclosed herein.

FIG. 8 illustrates a double bias memristive dot-product engine (800) having a double vector of voltage inputs (810, 812) and a double vector of outputs (814, 822) according to one example of the principles disclosed herein. The dot-product engine (800) includes a crossbar array (802) including N row electrodes (804) and M column electrodes (806). The crossbar junctions throughout the crossbar array (802) include a memristive element (808). The dot-product engine (800) includes a first vector input register or first vector input (810) for applying voltages to the row electrodes (804). A second vector input register or second vector input (812) for applying voltages to the row electrodes (804) is also incorporated into the dot product engine (800). The dot product engine (800) further includes a first vector output register or vector output (814) and a second vector output register or vector output (822) for receiving output voltages resulting from current flows in the column electrodes (806). The dot-product engine (800) also includes sense circuitry (816) for converting an electrical current in a column electrode (806) to a voltage. In an example of the principles described herein, the sense circuitry (816) includes an operational amplifier (818) and a resistor (820), which can be arranged to represent a virtual ground for read operations. Similar to the example described above, the dot-product engine (800) may also include the peripheral circuitry associated with crossbar arrays (802) used as storage devices, including, for example, driver, decoder, DAC, ADC and control circuitry, all of which can be fabricated using semiconductor processing techniques in the same integrated structure or semiconductor die as the crossbar array (FIG. 3, 302) in the above example.

Operation of the dot-product engine (800) is similar to that described above. A matrix of values [$a_{ij}$] is mapped onto the crossbar array (802) in the same manner as described above—e.g., each of the conductance values $G_{ij}$ is set by sequentially imposing a voltage drop over each of the crossbar junctions. Following programming, operation of the dot-product engine (800) proceeds by applying the first vector of input voltages (810) at the corresponding row electrodes (804) adjacent the j=1 column electrode (806) of the array (802) and the second vector of input voltages (812) at the corresponding row electrodes (804) adjacent the j=M column electrode (806) of the array (802). The output voltages are read at the first vector output register or vector output (814) and the second vector output register or vector output (822). The final result of the matrix multiplication is obtained by adding the voltages read at the first and second output vectors (814, 822).

Figure 9:
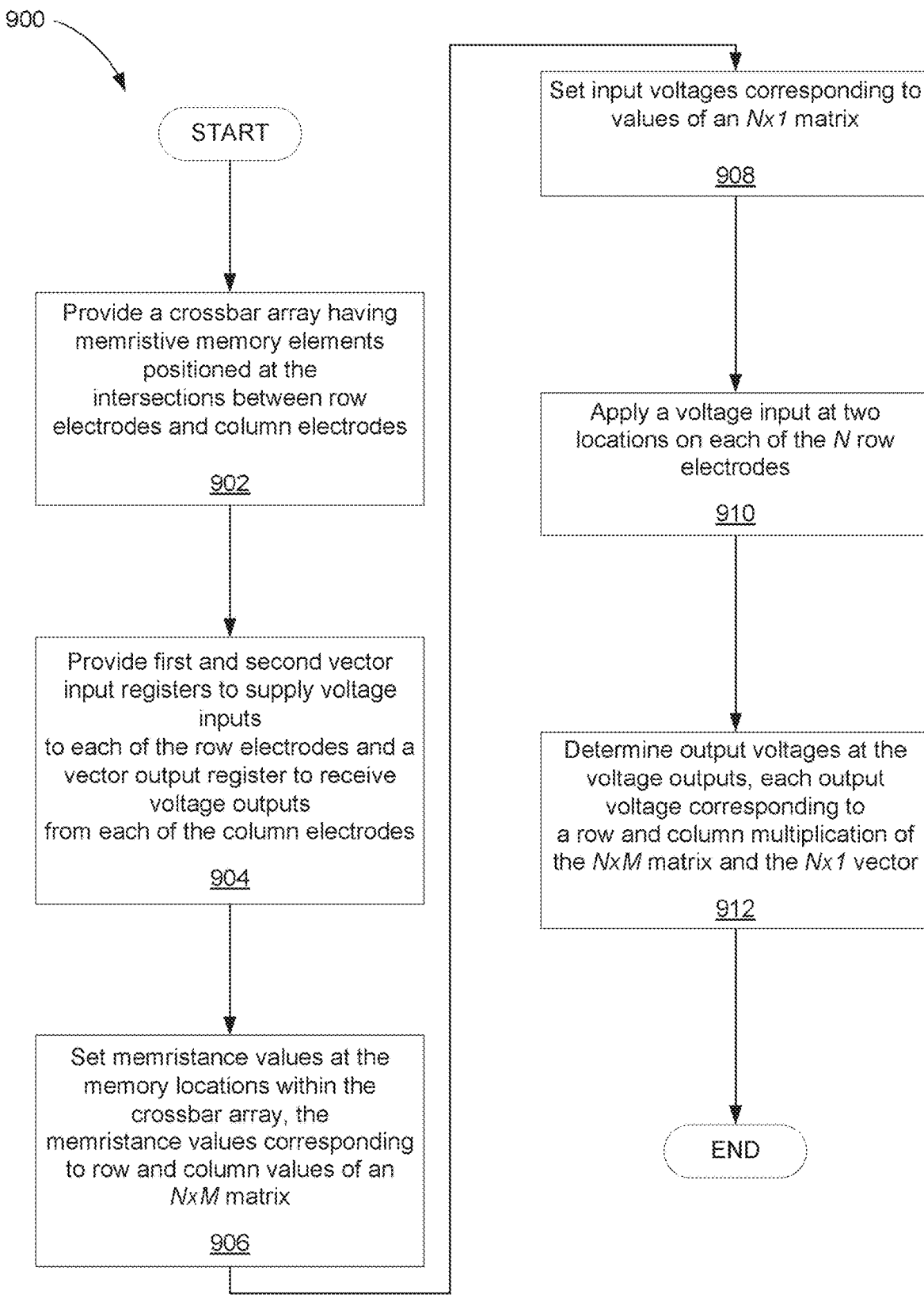
FIG. 9 is a flowchart showing a method for vector processing using a double bias memristive dot-product engine having a crossbar array according to one example of the principles described herein.

Referring now to FIG. 9, a method (900) for vector-processing using a double bias memristive dot-product engine (FIG. 5, 500) having a crossbar array (FIG. 5, 502) according to one example of the principles described herein is illustrated. According to certain examples, the method (900) may include providing (block 902) a crossbar array (FIG. 5, 502) of memristive storage devices. For example, the crossbar array (FIG. 5, 502) may include N row electrodes (FIG. 5, 504) and M column electrodes (FIG. 5, 506) to form an N×M grid of memory elements. The intersection of each row electrode (FIG. 5, 504) and column electrode (FIG. 5, 506) defines the memory element, which memory element includes a memristive storage device (FIG. 5, 508). The method (900) also includes providing (block 904) a number of vector input registers (FIG. 5, 510, 512) and vector output registers (FIG. 5, 514, FIG. 8, 822). For example, a first vector input register (FIG. 5, 510) supplies a first voltage input to each of the N row electrodes (FIG. 5, 504). Additionally, in some examples, a second vector input register (FIG. 5, 512) supplies a second voltage input to each of the N row electrodes (FIG. 5, 504). Still further, a first vector output register (FIG. 5, 514) receives voltage outputs from each of the M column electrodes (FIG. 5, 506). The method (900) may further include setting (block 906) memristance values at the N×M memory locations within the crossbar array (FIG. 5, 502), the memristance values corresponding to row and column values of an N×M matrix. For example, programming voltages may be sequentially applied to the row and column electrodes (FIG. 5, 504, 506) corresponding to the crossbar junctions of the N×M memory locations within the array (FIG. 5, 502). The method (900) may further include setting (block 908) input voltages corresponding to values of an N×1 matrix. The input voltages represent the values of the N×1 matrix to be multiplied against the N×M matrix of values. The method (900) may further include applying (block 910) a voltage input at two locations on each of the N row electrodes (FIG. 5, 504). For example, the voltage input corresponding to the first value in the N×1 matrix can be applied at the left and right-most ends of the first row in the crossbar array (FIG. 5, 502). Finally, the method (900) may include determining (block 912) output voltages at the M voltage outputs (FIG. 5, 514). Each output voltage corresponds to a row and column multiplication of the N×M matrix and the N×1 vector. In some examples, determining (block 912) output voltages may include multiplication by a resistive network that includes the resistor (FIG. 5, 520). In one example, the voltage outputs (FIG. 5, 514) may be determined using sense circuitry (FIG. 5, 516) that passes a current flowing through a column electrode (FIG. 5, 506) through a resistance, thereby allowing the voltage to be determined using Ohm's Law.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (FIG. 1, 101) of the computing system (FIG. 1, 100) or other programmable data processing apparatus, implement the functions or acts specified in the flowchart and/or block diagram block or blocks. In one example, the computer usable program code may he embodied within a computer readable storage medium; the computer readable storage medium being part of the computer program product. In one example, the computer readable storage medium is a non-transitory computer readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A double bias memristive dot-product system for vector processing, comprising:
    a crossbar array comprising N row electrodes, M column electrodes and N×M memory elements, the memory elements positioned at the intersections between the N row electrodes and the M column electrodes of the crossbar array, each memory element comprising a memristive storage device, the N×M memory elements to store values of an N×M matrix for multiplication;
    a first vector input register to supply first voltage inputs to each of the N row electrodes;
    a second vector input register to supply second voltage inputs to each of the N row electrodes, the first and second voltage inputs corresponding to values of an N×1 matrix;
    a vector output register to receive voltage outputs from each of the M column electrodes; and
    a sense circuit to convert an electrical current in each of the M column electrodes to a voltage using at least an operational amplifier, each voltage representing a dot product of one of the M columns and the N×1 matrix.

2. The system of claim 1, in which the first vector input register is connected to each of the N row electrodes at a jth column (j=1,M) and the second vector input register is connected to each of the N row electrodes at a kth column (k≠j).

3. The system of claim 2, in which the first vector input register is connected to each of the N row electrodes at a j=1 column and the second vector input register is connected to each of the N row electrodes at a j=M column.

4. The system of claim 2, in which the vector output register is connected to each of the M column electrodes at a row i=N.

5. The system of claim 4, further comprising a second vector output register to receive voltage outputs from each of the M column electrodes and in which the second vector output register is connected to each of the M column electrodes at a row i=1.

6. A double bias dot-product engine for vector processing, comprising:
    a crossbar array comprising N×M memory elements corresponding to values contained in an N×M matrix, the memory elements positioned at the intersections between N row electrodes and M column electrodes, each memory element comprising a memristive storage device;
    a first vector input register comprising N voltage inputs, each voltage input corresponding to a value contained in a vector having N values, connected to the crossbar array to supply first voltage inputs to each of the N row electrodes;
    a second vector input register comprising N voltage inputs, each voltage input corresponding to the values contained in the vector having N values, connected to the crossbar array to supply second voltage inputs to each of the N row electrodes;
    a first vector output register to receive voltage outputs from each of the M column electrodes; and
    a sense circuit to convert an electrical current in each of the M column electrodes to a voltage using at least an operational amplifier, each voltage representing a dot product of one of the M columns and the N×1 matrix.

7. The dot-product engine of claim 6, further comprising a second vector output register to receive voltage outputs from each of the M column electrodes.

8. The dot-product engine of claim 6, in which the first vector input register is connected to each of the N row electrodes at a j=1 column and the second vector input register is connected to each of the N row electrodes at a j=M column.

9. The dot-product engine of claim 7, in which the first vector output register is connected to each of the M column electrodes at a row i=N and the second vector output register is connected to each of the M column electrodes at a row i=1.

10. The dot-product engine of claim 7, further comprising analog to digital converters positioned between each of the M column electrodes and the output registers of the first and second vector output registers and digital to analog converters positioned between each of the N row electrodes and the input registers of the first and second vector input registers.

11. A method for vector-processing using a crossbar array, comprising:
    providing a crossbar array comprising N×M memory elements, the memory elements positioned at the intersections between N row electrodes and M column electrodes each memory element comprising:
        a memristive storage device;
        a first input from a first vector input register to supply first voltage inputs to each of the N row electrodes;
        a second input from a second vector input register to supply second voltage inputs to each of the N row electrodes; and
        a first output to a first vector output register to receive voltage outputs from each of the M column electrodes;
    setting memristance values at the N×M memory locations within the crossbar array, the memristance values corresponding to row and column values of an N×M matrix;
    setting input voltages corresponding to values of an N×1 matrix;
    applying a voltage input at two locations on each of the N row electrodes; and
    determining output voltages at the M voltage outputs, each output voltage determined, in part, using an operational amplifier and corresponding to a dot product of one of the columns of the N×M matrix and the N×1 vector.

12. The method of claim 11, in which for each of the N row electrodes, an input voltage is applied at a j=1 and j=M columns.

13. The method of claim 11, in which the crossbar array further comprises a second output from a second vector output register to receive voltage outputs from each of the M column electrodes and in which the first vector output register is connected to each of the M column electrodes at a row i=N and the second vector output register is connected to each of the M column electrodes at a row i=1.

14. The method of claim 13, wherein the voltage output at each of the M columns is determined by passing current outputs received at rows i=1 and i=N for each of the M columns of the crossbar array through a resistance device.

15. The method of claim 11, wherein setting memristance values at the N×M memory locations, setting input voltages at the N voltage inputs, applying the voltage inputs and determining output voltages at the M voltage outputs is performed iteratively until a convergence criteria is satisfied.

16. The system of claim 1, wherein the electrical current available at the sense circuit is caused by concurrent application of the first voltage inputs and the second voltage inputs.

17. The dot-product engine of claim 6, wherein the received voltage outputs from each of the M column electrodes is responsive to concurrent application of the N voltage inputs from both the first vector input register and the second vector input register.

18. The method of claim 11, wherein the output voltages at the M voltage outputs is caused by concurrent application of the voltage input at the two locations on each of the N row electrodes.

19. The system of claim 4, further comprising a second vector output register to receive voltage outputs from each of the M column electrodes.

20. The dot-product engine of claim 6, further comprising a second vector output register to receive voltage outputs from each of the M column electrodes.

* * * * *